United States Patent [19]

Macomber

[11] Patent Number: 5,345,466
[45] Date of Patent: Sep. 6, 1994

[54] CURVED GRATING SURFACE EMITTING DISTRIBUTED FEEDBACK SEMICONDUCTOR LASER

[75] Inventor: Steven H. Macomber, Bethel, Conn.

[73] Assignee: Hughes Aircraft Company, Los Angeles, Calif.

[21] Appl. No.: 974,775

[22] Filed: Nov. 12, 1992

[51] Int. Cl.$^5$ .......................... H01S 3/08; H01S 3/18
[52] U.S. Cl. ......................................... 372/96; 372/7;
372/19; 372/43; 372/50; 372/102
[58] Field of Search .................. 372/7, 19, 43, 48, 49,
372/50, 96, 102

[56] References Cited

U.S. PATENT DOCUMENTS

| | | | |
|---|---|---|---|
| 4,532,632 | 7/1985 | Yamashita et al. | 372/50 |
| 4,573,163 | 2/1986 | Kaminow | 372/96 |
| 4,783,788 | 11/1988 | Gordon | 372/45 |
| 4,803,696 | 2/1989 | Pepper et al. | 372/96 X |
| 4,815,084 | 3/1989 | Scifres et al. | 372/46 |
| 4,975,923 | 12/1990 | Buus et al. | 372/50 |
| 4,977,567 | 12/1990 | Hanke | 372/96 X |
| 5,016,253 | 5/1991 | Kubota | 372/50 |
| 5,091,916 | 2/1992 | Cimini, Jr. et al. | 372/96 |
| 5,164,956 | 11/1992 | Lang | 372/96 |
| 5,241,556 | 8/1993 | Macomber et al. | 372/96 |
| 5,282,220 | 1/1994 | Macomber | 372/96 |

*Primary Examiner*—Brian Healy
*Attorney, Agent, or Firm*—Hugh P. Gortler; M. W. Sales; W. K. Denson-Low

[57] ABSTRACT

An improved broad area surface emitting distributed feedback semiconductor laser diode device (10) includes a P-side ohmic contact (28) and an N-side ohmic contact (36). A potential difference is applied across these contacts to create an electric field that induces a stimulated emission of coherent photon radiation. The coherent photon radiation produced by the stimulated emission process is incident upon a second order grating having a curved pattern incorporated therein (29). An output beam, directed normal to a chemically etched output window (38), is produced by a first order diffraction of photon radiation from the surface of the second order curved grating (29). The output beam has a more uniform lateral mode near-field output intensity profile and a more uniform lateral mode near-field phase. The output beam also has a desired single-lobed lateral mode far-field output intensity profile. Moreover, the device (10) concentrates approximately 1 Watt of power into this single lateral mode far-field lobe.

25 Claims, 1 Drawing Sheet

CURVED GRATING SURFACE EMITTING DISTRIBUTED FEEDBACK SEMICONDUCTOR LASER

BACKGROUND OF THE INVENTION

1. FIELD OF THE INVENTION

The present generally relates to semiconductor lasers and, in particular, to a broad area surface emitting distributed feedback semiconductor laser that incorporates a curved pattern in a second order grating to produce a predominantly single-lobed lateral mode far-field output intensity profile at relatively high power.

2. DESCRIPTION OF THE PRIOR ART

Light amplification by the stimulated emission of radiation (laser) produces unidirectional, monochromatic, and, most importantly, coherent visible light. The stimulated emission of radiation is a process in which the energy state of an atom changes in a quantum transition with the emission of a photon. During such a process, a photon approaches an atom, initially in an excited energy state, and induces this atom to make a transition to a lower energy state. As the atom's energy state is lowered, the atom emits a photon. This emitted photon, which is separate from the photon that induced the energy transition, possesses an energy that is equal to the difference between the excited and the lower energy states of the atom. Moreover, this emitted photon and the inducing photon both leave the atom in the same direction the inducing photon had as it approached the atom. These exiting photons are also exactly in relative phase with one another; that is, they are coherent. This coherence is dictated by energy conservation in that if the two photons were out of phase by any amount they would interfere destructively, thereby violating energy conservation. Therefore, stimulated emission of radiation is a process that induces coherent photon multiplication or light amplification, thus a laser.

Laser technology has evolved by applying the above stated principle to several different types of active media. The most recent development in this field, coupled with the advancements in semiconductor fabrication technology, is the semiconductor laser. Unlike prior lasers, however, stimulated emission in a semiconductor laser occurs when there is an excited state of a solid state material. Thus, stimulated emission in a semiconductor laser involves more than one atom.

A surface emitting distributed feedback semiconductor laser is a device that produces unidirectional, monochromatic, coherent visible light through stimulated emission in semiconductor materials. Such a device has a positively doped side and a negatively doped side that are joined at a junction, and a grating that is etched into an outer surface of the positively doped side. The surface of the grating, upon which a strong conductive material is disposed, provides a means by which coherent photon energy fields may be diffracted. A second order grating design permits deflections of coherent photon radiation to be directed normal to an output window etched into the negatively doped side of the junction through first order diffraction, and directed parallel to the surface of the grating through second order diffraction. The first order diffraction produces a beam of unidirectional, monochromatic, coherent visible light at the output window, whereas the second order diffraction provides a feedback of photon radiation to an active region that is adjacent and parallel to the surface of the grating. Much has been written on the subject of semiconductor lasers in recent years and some good descriptive background articles on these devices are *Surface Emitting Distributed Feedback Semiconductor Laser*, Applied Physics Letters, Volume 51, Number 7, pp. 472–474, August 1987, and *Analysis of Grating Surface Emitting Lasers*, IEEE Journal of Quantum Electronics, Volume 26, Number 3, pp. 456–466, March 1990.

Along the length of a surface emitting distributed feedback semiconductor laser diode device having a uniform, or linear, grating, a theoretical longitudinal mode near-field output intensity profile is double-lobed and antisymmetric with a zero intensity null at the output window center. A corresponding theoretical longitudinal mode far-field output intensity profile is double-lobed and symmetric about the output window center. These theoretical longitudinal mode output intensity profiles have been substantiated in actual device measurements, although in these measurements it has been found that spontaneous emission partially fills the near-field intensity null at the output window center. Nonetheless, the longitudinal mode output intensity profiles associated with a surface emitting distributed feedback semiconductor laser diode device having a linear grating are acceptable for many applications due to a consistent mode relationship between the first and the second order diffracted photon radiation along the length of the grating.

Along the width of a surface emitting distributed feedback semiconductor laser diode device having a uniform, or linear, grating surface, however, a lateral mode near-field output intensity profile and a lateral mode far-field output intensity profile are not acceptable for many applications due essentially to self-guiding and filamentation effects. Such effects result in the lateral mode near-field output intensity profile having an increasing number of lobes as the width of the linear grating increases. Furthermore, there is a 180 degree near-field phase shift between each near-field lobe. The corresponding lateral mode far-field output intensity profile displays a double-lobed pattern centered about the location of each 180 degree near-field phase shift.

One reason that the lateral mode output intensity profiles associated with a surface emitting distributed feedback semiconductor laser diode device having a linear grating are not acceptable for many applications is that it is often required that the width of a grating be increased, or a broad area grating be created, in order to increase the output beam power of the device. Such an increase in grating width, although allowing an increase in the power applied to the device, results in an increase in the number of far-field lobes, which is unacceptable for many applications. It is therefore desirable to increase the output beam power of a broad area surface emitting distributed feedback semiconductor laser diode device, while concentrating that output beam power into a single far-field lobe.

SUMMARY OF THE INVENTION

The present invention contemplates a broad area surface emitting distributed feedback semiconductor laser diode device that incorporates a curved pattern in a second order grating to produce a predominantly single-lobed, lateral mode far-field output intensity profile at relatively high power. This second order curved grating is holographically patterned, by a process described in the related and copending patent application Ser. No. 07/975,303, pending, entitled, Apparatus and Method for Fabricating a Curved Grating in a Surface Emitting Distributed Feedback Semiconductor Laser Device, filed on even date herewith, and assigned to the assignee hereof. Therein a technique is described wherein a grating is chemically etched into a surface of a thin, positively doped cladding layer of an aluminum, gallium, and arsenic material compound (AlGaAs) that is grown on a negatively doped AlGaAs cladding layer. This negatively doped AlGaAs cladding is grown on a negatively doped gallium and arsenic material compound (GaAs) substrate. The surface of the second order curved grating is coated with gold (Au) metal to attain a high diffraction efficiency, and to reduce radiation losses in photon energy fields incident upon this surface.

In one embodiment of the present invention, stimulated emission occurs in an electrically pumped section of an active region between the positively and negatively doped AlGaAs cladding layers. A portion of the photon energy exiting this stimulated emission region is incident upon the surface of the gold coated curved grating. This photon radiation is deflected normal to the negatively doped AlGaAs cladding through first order diffraction and deflected along the surface of the gold coated grating through second order diffraction. The first order diffraction produces a beam of photon radiation that is directed through an output window etched into the negatively doped GaAs substrate. The second order diffraction produces a feedback of photon radiation to the stimulated emission region by way of two oppositely directed photon fields. These oppositely directed photon fields propagate along directions perpendicular to the grating grooves and parallel to the surface of the grating. Since there is only a thin, positively doped AlGaAs cladding layer between the second order curved grating and the active region, the second order diffracted photon fields are fed back into the stimulated emission region, thereby amplifying the stimulated emission process. As will now be described, amplitude functions in both a lengthwise, or longitudinal, and a widthwise, or lateral, direction of these oppositely directed, second order diffracted photon fields have magnitudes which are directly dependent upon the structure of the second order curved grating.

A uniform, or linear, second order grating will produce two oppositely directed, second order diffracted photon fields whose longitudinal amplitude functions are antisymmetric to one another about the lengthwise center of the grating, and whose lateral amplitude functions are antisymmetric to one another along entire width of the grating. The superposition of these oppositely directed photon fields leads to an abrupt 180 degree phase shift in the longitudinal mode near-field phase at the lengthwise center of the output window, and to a series of abrupt 180 degree phase shifts in the lateral mode near-field phase along the entire width of the output window, respectively. These phase shifts are caused by a total destructive interference interaction between the antisymmetric, oppositely directed photon fields at the lengthwise center of the grating, and at a series of points along the entire width of the grating, respectively. The longitudinal mode output intensity profiles produced by a broad area surface emitting distributed feedback semiconductor laser diode device with this type of interference interaction in the second order diffracted photon radiation are an antisymmetric near-field with a zero intensity null at the lengthwise center of the output window, and a corresponding symmetric, double-lobed far-field. The lateral mode output intensity profiles produced by the same broad area surface emitting distributed feedback semiconductor laser diode device with this type of interference interaction in the second order diffracted photon radiation are an antisymmetric near-field with a series of zero intensity nulls along the entire width of the output window, and a corresponding symmetric, multi-lobed far-field.

A grating having a curved pattern incorporated therein will produce two oppositely directed, second order diffracted photon fields whose longitudinal amplitude functions are similar to those of the linear grating described above, but whose lateral amplitude functions are more uniform along the entire width of the grating. The superposition of these oppositely directed photon fields again leads to an abrupt 180 degree phase shift in the longitudinal mode near-field phase at the lengthwise center of the output window, but also leads to a more uniform lateral mode near-field phase with no abrupt 180 degree phase shifts along the entire width of the output window, respectively. These phase shifts are again caused by a total destructive interference interaction between the antisymmetric, oppositely directed photon fields at the lengthwise center of the grating, but are eliminated by a reduced interference interaction along the entire width of the grating, respectively. The longitudinal mode output intensity profiles produced by a broad area surface emitting distributed feedback semiconductor laser diode device with this type of interference interaction in the second order diffracted photon radiation are again an antisymmetric near-field with a zero intensity null at the lengthwise center of the output window, and a corresponding symmetric, double-lobed far-field. The lateral mode output intensity profiles produced by the same broad area surface emitting distributed feedback semiconductor laser diode device with this type of interference interaction in the second order diffracted photon radiation are, however, a more uniform near-field with no more zero intensity nulls along the entire width of the output window, and a corresponding symmetric, single-lobed far-field. This desired single-lobed lateral mode far-field output intensity profile is due essentially to the elimination of the series of abrupt 180 degree near-field phase shifts in the lateral mode near-field phase.

Accordingly, so it is one object of the present invention to provide a broad area surface emitting distributed feedback semiconductor laser diode device that produces a predominantly single-lobed lateral mode far-field output intensity profile.

Another object of the present invention is to provide a broad area surface emitting distributed feedback semiconductor laser diode device with a curved pattern in a second order grating.

Other objects and advantages will become apparent to those skilled in the art from the following detailed description of the invention read in conjunction with the appended claims and the drawings attached hereto.

BRIEF DESCRIPTION OF THE DRAWINGS

The drawings, not drawn to scale, include.

DETAILED DESCRIPTION OF THE INVENTION

Figure 1:
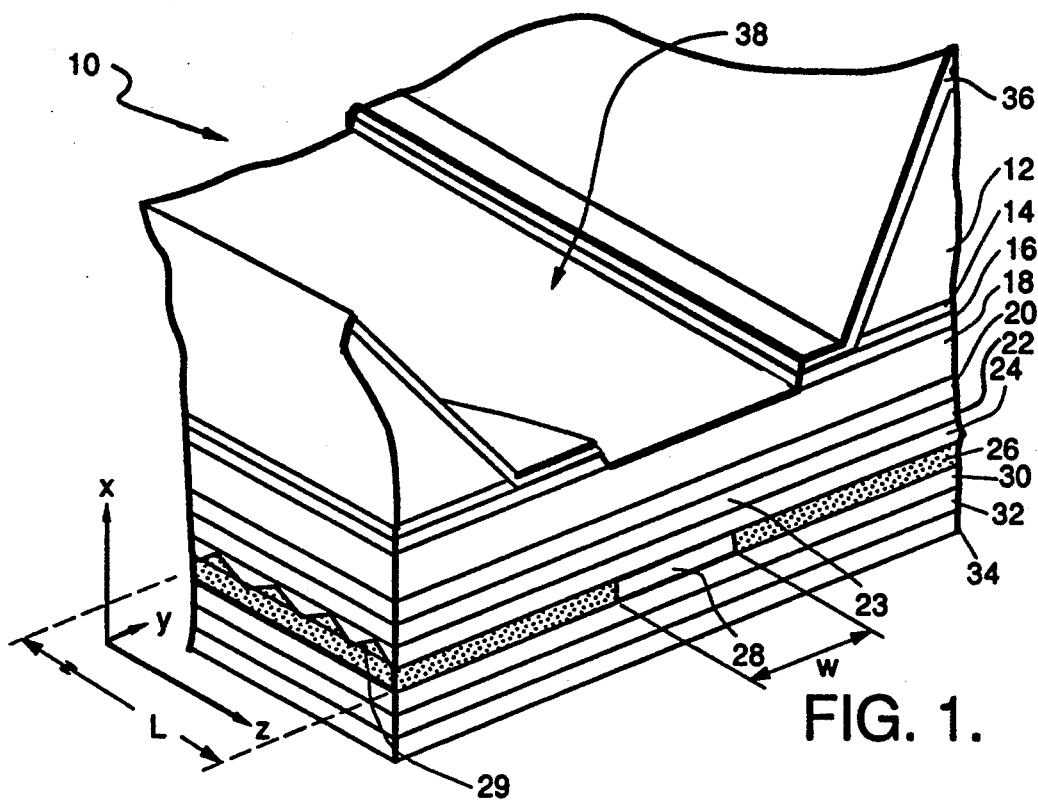
FIG. 1 is a cross-sectional view of a broad area surface emitting distributed feedback semiconductor laser diode device having a structure embodying the principles of the present invention.

Referring to FIG. 1, there is shown a cross-sectional view of a broad area surface emitting distributed feedback semiconductor laser diode device 10 having a second order curved grating 29. In this embodiment, the laser diode device 10 is fabricated on a negatively (N) doped GaAs substrate 12. Many epitaxial layers are grown on this substrate 12, including a stop-etch layer 14, an N-doped GaAs layer 16, an N-doped AlGaAs cladding layer 18, an N-doped AlGaAs confinement layer 20, an AlGaAs active layer 22, and a thin, positively (P) doped AlGaAs cladding layer 24. The P-doped AlGaAs epitaxial cladding layer 24 is coated with photoresist, holographically exposed, and chemically etched to create the second order curved grating 29. A dielectric mask of silicon dioxide ($SiO_2$) 26 is then deposited over the surface of the P-doped AlGaAs grating 29 for isolation and current confinement.

The N-doped GaAs substrate 12 is coated with photoresist and optically patterned and etched to produce a well, exposing the N-doped GaAs epitaxial layer 16. A gold, germanium, and nickel material compound (AuGeNi) layer 36 is deposited on the N-side of the laser diode structure. Another photoresist mask is applied and pattern exposed to the N-side contact 36 and an output window 38 is formed by chemical etching. The gold, germanium, and nickel material compound (AuGeNi) layer is then annealed to serve as an ohmic contact. The output window allows photon radiation diffracted normal from the surface of the second order curved grating 29 to exit laser diode device 10.

A broad area stripe 28 of length, L, along the Z-axis coordinate and width, W, along the Y-axis coordinate is etched into the $SiO_2$ layer 26 down to the surface of the grating 29. Gold (Au) metal is then evaporated into this striped region 28. The resulting broad area gold stripe 28 serves as an ohmic contact for the P-side of the laser diode structure 10, Barrier metal layers of chromium (Cr) 30, platinum (Pt) 32, and gold 34 are then deposited over the broad area gold stripe 28 and $SiO_2$ 26 regions to provide low thermal resistance in the negative X-axis coordinate direction.

When a positive potential difference is applied from the P-side ohmic contact 28 to the N-side ohmic contact 36 of the laser diode structure 10, an electric field is produced in the positive X-axis coordinate direction. This electric field provides two conditions that are essential for the broad area semiconductor lasing process.

First, as the potential difference, and the corresponding electric field, between the P-side 28 and the N-side 36 ohmic contacts is increased, a recombination of electrons from the N-side with holes from the P-side is increased. During a single recombination process the electric field drives a mobile electron from the N-side 20 and a mobile hole from the P-side 24 into the active layer 22, where the mobile electron is annihilated by the mobile hole. In this process, a solid state material, that is initially in an excited energy state with a mobile hole in its valence band, transitions to a lower energy state as a mobile electron fills this mobile hole. This energy transition results in the emission of a photon at an energy equal to the difference between the excited and lower energy states. This process is called spontaneous emission.

Secondly, stimulated emission is a process in which an incoming photon stimulates an excited energy state solid state material to make a transition to a lower energy state, whereby an additional photon is created. This newly created photon and the incoming photon both leave the atom in a coherent manner. Stimulated absorption is a process in which an incoming photon stimulates, or induces, a low energy state of a molecule, or a solid state material atom, to make a transition to a higher energy state, and the photon is absorbed. For light amplification, or lasing, to occur the stimulated emission process must dominate the stimulated absorption process. In the case of the semiconductor laser 10 described here, this situation occurs when energy from the positive X-axis coordinate directed electric field electrically pumps a region 23 in the AlGaAs active layer 22, of the same length, L, and width, W, as the broad area gold stripe 28. This electrical pumping induces excited electrons and holes in the AlGaAs material, initially in a low energy state, to transition to an upper energy state, thereby creating a high density of electrons and holes, or a population inversion, in the electrically pumped region of the active layer 22. This population inversion provides a greater probability that an incoming photon will induce a stimulated emission rather than a stimulated absorption, and thus stimulated emission is the dominant process.

In the present invention, spontaneous emission provides photons to the electrically pumped region 23 of the AlGaAs active layer 22. These spontaneously emitted photons initiate a stimulated emission process in this region due to a population inversion. Once initiated, the laser oscillates in a self-perpetuating manner and at a frequency that is determined by a feedback mechanism, which in this type of laser device 10 is the second order curved grating 29. A portion of the coherent photon radiation produced from the stimulated emission process is incident upon the surface of the grating 29 in the broad area gold stripe region 28. This incident photon radiation is partially deflected in the positive X-axis coordinate direction through first order diffraction and partially deflected in both the positive and negative Z-axis coordinate direction through second order diffraction. The first order diffraction produces a coherent beam of photon radiation directed through the output window 38. The second order diffraction produces a coherent feedback of photon radiation to the electrically pumped active region 23 by way of a positive Z-axis coordinate directed photon field and a negative Z-axis coordinate directed photon field. As will be described shortly, amplitude functions in both a lengthwise, or longitudinal, and a widthwise, or lateral, direction of these oppositely directed, second order diffracted photon fields have magnitudes which are directly dependent upon the structure of the second order curved grating 29.

Figure 2:
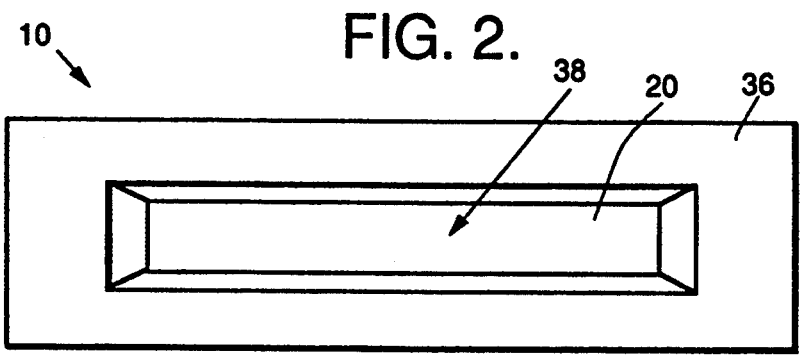
FIG. 2 is a top plan view of the broad area surface emitting distributed feedback semiconductor laser diode device shown in FIG. 1.
Figure 3:
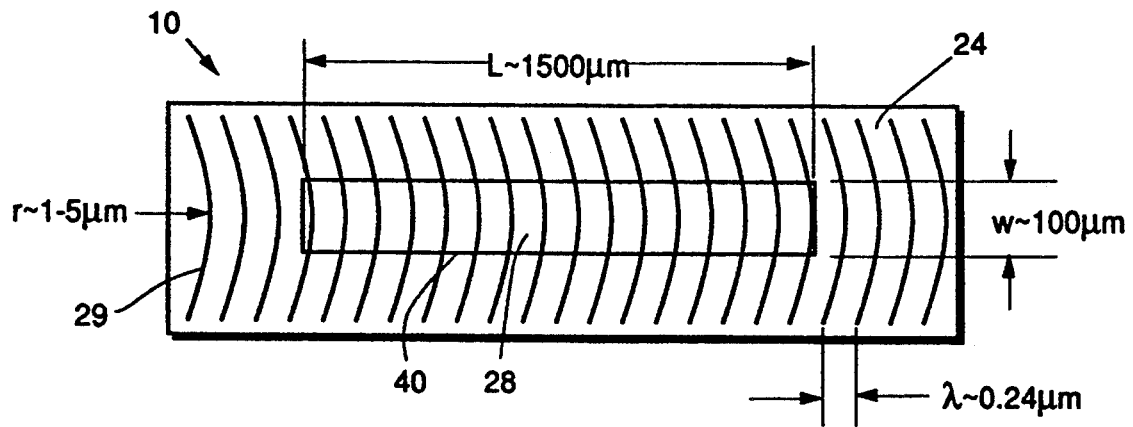
FIG. 3 is a bottom plan view of the broad area surface emitting distributed feedback semiconductor laser diode device shown in FIG. 1, with several layers removed to reveal the second order curved grating.

Referring to FIGS. 2 and 3, there is shown a top view and a bottom view, with the layers 26,28,30,32,34 removed, respectively, of the broad area surface emitting distributed feedback semiconductor laser diode device 10 shown in FIG. 1. Referring specifically to FIG. 3, the second order curved grating 29 is shown along with an outline 40 of the broad area gold stripe region 28. The gold stripe region 28 is shown with an approximate length, L=1500 μm, and an approximate width W=100 μm, which classifies it as a broad area. The second order curved grating 29 is shown with a constant radius of curvature, r, which can range from approximately 1.0 to 5.0 millimeters. It should be noted that it has been described in *AlGaAs Surface-Emitting Distributed Feedback Laser*, Proceedings of the SPIE, 1988, that an optimal grating periodicity, A, for a surface emitting distributed feedback semiconductor laser diode device with an AlGaAs active material is on the order of 0.24 μm, which is what is used here. As will now be described, even such a small variation in the curvature of the grating 29 as presented here can have a dramatic effect on the lateral mode output intensity profiles.

A broad area surface emitting distributed feedback semiconductor laser diode device having a second order uniform, or linear, grating incorporated therein, but otherwise similar to the device 10 shown in FIGS. 1, 2, and 3, will produce two oppositely directed, second order diffracted photon fields whose longitudinal amplitude functions are antisymmetric to one another about the lengthwise center of a broad area gold stripe region, and whose lateral amplitude functions are antisymmetric to one another along entire width of the broad area gold stripe region. The superposition of these oppositely directed photon fields leads to an abrupt 180 degree phase shift in the longitudinal mode near-field phase at the lengthwise center of an output window, and to a series of abrupt 180 degree phase shifts in the lateral mode near-field phase along the entire width of the output window, respectively. These phase shifts are caused by a total destructive interference interaction between the antisymmetric, oppositely directed photon fields at the lengthwise center of the broad area gold stripe region, and at a series of points along the entire of the broad area gold stripe region, respectively. The longitudinal mode output intensity profiles produced by a broad area surface emitting distributed feedback semiconductor laser device with this type of interference interaction in the second other diffracted photon radiation are an antisymmetric near-field with a zero intensity null at the lengthwise center of the output window, and a corresponding symmetric, double-lobed far-field. The lateral mode output intensity profiles produced by the same broad area surface emitting distributed feedback semiconductor laser device with this type of interference interaction in the second order diffracted photon radiation are an antisymmetric near-field with a series of zero intensity nulls along the entire width of the output window, and a corresponding symmetric, multi-lobed far-field.

In comparison, the broad area surface emitting distributed feedback semiconductor laser diode device 10 having the second order curved grating 29 incorporated therein, as shown in FIGS. 1, 2, and 3, will produce two oppositely directed, second order diffracted photon fields whose longitudinal amplitude functions area again antisymmetric to one another about the lengthwise center of the broad area gold stripe region 28, but also whose lateral amplitude functions are more uniform along the entire width of the board area gold stripe region 28. The superposition of these oppositely directed photon fields again leads to an abrupt 180 degree phase shift in the longitudinal mode near-field phase at the lengthwise center of the output window 38, but also leads to a more uniform lateral mode near-field phase with no abrupt 180 degree phase shifts along the entire width of the output window 38, respectively. These phase shifts are again caused by a total destructive interference interaction between the antisymmetric, oppositely directed photon fields at the lengthwise center of the broad area gold stripe region 28, but are eliminated by a reduced interference interaction along the entire width of the broad are gold stripe region 28, respectively. The longitudinal mode output intensity profiles produced by a broad area surface emitting distributed feedback semiconductor laser device with this type of interference interaction in the second order diffracted photon radiation are again an antisymmetric near-field with a zero intensity null at the lengthwise center of the output window 38, and a corresponding symmetric, double-lobed far-field. The lateral mode output intensity profiles produced by the same broad area surface emitting distributed feedback semiconductor laser device with this type of interference interaction in the second order diffracted photon radiation are, however, a more uniform near-field with no more zero intensity nulls along the entire width of the output window 38, and a corresponding symmetric, single-lobed far-field. This desired single-lobed lateral mode far-field output intensity profile is achieved by suppressing self-guiding and filamentation effects which would otherwise be dominant in the device 10, thus essentially eliminating the series of abrupt 180 degree near-field phase shifts in the lateral mode near-field phase. Furthermore, it is expected that such a device 10 will concentrate approximately 1 Watt of power into this single lateral mode far-field lobe.

With the present invention device 10 now fully described, it can thus be seen that the objectives set forth above are efficiently attained and, since certain changes may be made in the above-described device 10 without departing from the spirit and scope of the invention, it is intended that all matter contained in the above description or shown in the accompanying drawings shall be interpreted as illustrative and not in a limiting sense.

What is claimed is:

1. An improved broad area surface emitting distributed feedback semiconductor laser diode device having a structure of dielectric, metal, and semiconductor material layers, including a positively doped semiconductor cladding layer having a grating etched into its surface, said grating having a plurality of grating grooves, said improvement comprising: a curved pattern incorporated into said grating for producing a predominantly single-lobed lateral mode far-field output intensity profile at relatively high power.

2. The surface emitting distributed feedback semiconductor laser diode device as described in claim 1, wherein said curved grating is of a second order.

3. The surface emitting distributed feedback semiconductor laser diode device as described in claim 2, wherein said laser diode device has an ohmic contact of length L and width W along a surface of said second order curved grating.

4. The surface emitting distributed feedback semiconductor laser diode device as described in claim 3, wherein said ohmic contact length, L, has a value of approximately 1500 μm.

5. The surface emitting distributed feedback semiconductor laser diode device as described in claim 3, wherein said ohmic contact width, W, has a value of approximately 100 μm.

6. The surface emitting distributed feedback semiconductor laser diode device as described in claim 2, wherein said curved pattern incorporated into said second order grating has a constant radius of curvature, r.

7. The surface emitting distributed feedback semiconductor laser diode device as described in claim 6, wherein said constant radius of curvature, r, has a range of values from approximately 1.0 to 5.0 millimeter.

8. The surface emitting distributed feedback semiconductor laser diode device as described in claim 1, wherein each of said grating grooves are substantially equidistant from one another, and wherein a distance between each of said grating grooves is expressed by a constant grating periodicity, $\Lambda$.

9. The surface emitting distributed feedback semiconductor laser diode device as described in claim 8, wherein said constant grating periodicity, $\Lambda$, has a value of approximately 0.24 $\mu$m.

10. The surface emitting distributed feedback semiconductor laser diode device as described in claim 1, wherein approximately 1 Watt of power is concentrated into said single lateral mode far-field lobe.

11. A broad area surface emitting distributed feedback semiconductor laser diode device comprising:
   a negatively doped semiconductor material substrate;
   a plurality of semiconductor material epitaxial layers;
   a curved grating pattern etched into one of said semiconductor material epitaxial layers;
   a dielectric material layer;
   a duality of ohmic contacts;
   a plurality of barrier metal layers; and
   an output window etched into said semiconductor material substrate.

12. The surface emitting distributed feedback semiconductor laser diode device as described in claim 11, wherein said negatively doped semiconductor substrate is of a gallium and arsenic material compound (GaAs).

13. The surface emitting distributed feedback semiconductor laser diode device as described in claim 11, wherein said semiconductor epitaxial layers comprise:
   a stop etch layer;
   a negatively doped GaAs layer;
   a negatively doped aluminum, gallium and arsenic material compound (AlGaAs) cladding layer;
   a negatively doped AlGaAs confinement layer;
   a AlGaAs active layer; and
   a positively doped AlGaAs cladding layer.

14. The surface emitting distributed feedback semiconductor laser diode device as described in claim 13, wherein said AlGaAs active layer is positively doped.

15. The surface emitting distributed feedback semiconductor laser diode device as described in claim 13, wherein said AlGaAs active layer is negatively doped.

16. The surface emitting distributed feedback semiconductor laser diode device as described in claim 11, wherein said curved grating pattern is of a second order, and wherein said second order curved grating pattern has a plurality of grating grooves that are substantially equidistant from one another.

17. The surface emitting distributed feedback semiconductor laser diode device as described in claim 16, wherein said second order curved grating pattern has a constant radius of curvature, r.

18. The surface emitting distributed feedback semiconductor laser diode device as described in claim 17, wherein said constant radius of curvature, r, has a range of values from approximately 1.0 to 5.0 millimeter.

19. The surface emitting distributed feedback semiconductor laser diode device as described in claim 16, wherein a distance between each of said equidistant grating grooves is expressed by a constant grating periodicity, $\Lambda$.

20. The surface emitting distributed feedback semiconductor laser diode device as described in claim 19, wherein said constant grating periodicity, $\Lambda$, has a value of approximately 0.24 $\mu$m.

21. The surface emitting distributed feedback semiconductor laser diode device as described in claim 11, wherein said duality of ohmic contacts comprise:
   a gold (Au) metal material evaporated directly onto said grating to form a P-side ohmic contact; and
   a gold, germanium, and nickel material compound (AuGeNi deposited directly onto said substrate to form an N-side ohmic contact.

22. The surface emitting distributed feedback semiconductor laser diode device as described in claim 21, wherein said P-side ohmic contact has a length L and a width W along a surface of said curved grating pattern.

23. The surface emitting distributed feedback semiconductor laser diode device as described in claim 22, wherein said P-side ohmic contact length, L, has a value of approximately 1500 $\mu$m.

24. The surface emitting distributed feedback semiconductor laser diode device as described in claim 22, wherein said P-side ohmic contact width, W, has a value of approximately 100 $\mu$m.

25. The surface emitting distributed feedback semiconductor laser diode device as described in claim 11, wherein said barrier metal layers comprise:
   a chromium (Cr) metal layer;
   a platinum (Pt metal layer; and
   a gold (Au) metal layer.

* * * * *